United States Patent
Yeager et al.

(10) Patent No.: US 10,097,283 B1
(45) Date of Patent: Oct. 9, 2018

(54) WATCH-CRYSTAL-BASED RF TRANSMITTER

(71) Applicant: Verily Life Sciences LLC, Mountain View, CA (US)

(72) Inventors: Daniel Yeager, San Francisco, CA (US); Amirpouya Kavousian, San Jose, CA (US)

(73) Assignee: Verily Life Sciences LLC, South San Francisco, CA (US)

( * ) Notice: Subject to any disclaimer, the term of this patent is extended or adjusted under 35 U.S.C. 154(b) by 0 days.

(21) Appl. No.: 15/364,307

(22) Filed: Nov. 30, 2016

(51) Int. Cl.
*H03C 3/00* (2006.01)
*H04B 17/11* (2015.01)
*H04L 7/033* (2006.01)
*H04L 12/801* (2013.01)
*H04L 27/20* (2006.01)
*H04W 52/52* (2009.01)

(52) U.S. Cl.
CPC .............. *H04B 17/11* (2015.01); *H04L 7/033* (2013.01); *H04L 27/2017* (2013.01); *H04L 47/29* (2013.01); *H04W 52/52* (2013.01)

(58) Field of Classification Search
CPC .......... H04B 2201/70715; H04B 11/00; H04B 2215/065; G01S 5/02; H04L 27/30; H03L 7/085; H03L 7/08; H03L 7/087; H04W 52/0225; H04W 52/0261; H04W 52/0277; G04R 40/02
See application file for complete search history.

(56) References Cited

U.S. PATENT DOCUMENTS

| 7,701,997 | B2 * | 4/2010 | Tal | H03C 3/40 375/132 |
| 9,077,353 | B2 | 7/2015 | McDonald et al. | |
| 2006/0205373 | A1 * | 9/2006 | Lu | H04B 1/1615 455/255 |
| 2008/0137773 | A1 * | 6/2008 | Afsahi | H03F 1/0277 375/300 |
| 2009/0309666 | A1 * | 12/2009 | Sun | H03L 7/099 331/44 |

OTHER PUBLICATIONS

Atmel, "AVR055: Using a 32kHz XTAL for run-time calibration of the internal RC," Copyright 2008; http://www.atmel.com/images/doc8002.pdf.

(Continued)

*Primary Examiner* — Rahel Guarino
(74) *Attorney, Agent, or Firm* — Kilpatrick Townsend & Stockton LLP (57) ABSTRACT

Example radio frequency (RF) transmitters and associated methods are disclosed. One example RF transmitter includes an RF oscillator, a real-time clock (RTC) oscillator, and a control circuit. The control circuit is configured to determine whether a calibration of the RF oscillator is needed; electrically couple the RF oscillator to the RTC oscillator and initiate calibrating of the RF oscillator using the RTC oscillator when it is determined that the calibration is needed; and activate the RF oscillator to operate in an open-loop mode to generate an RF signal for data transmission. The calibration can be performed in a closed-loop mode before the data transmission or in an open-loop mode during the data transmission.

29 Claims, 6 Drawing Sheets

(56) References Cited

OTHER PUBLICATIONS

Babaie et al., "A Fully Integrated Bluetooth Low-Energy Transmitter in 28 nm CMOS With 36% System Efficiency at 3 dBm," IEEE Journal of Solid-State Circuits 51.7 (2016): 1547-1565.

McCorquodale et al., "A monolithic and self-referenced RF LC clock generator compliant with USB 2.0," IEEE Journal of Solid-State Circuits 42.2 (2007): 385-399.

Paidimarri et al., "A +10 dBm BLE Transmitter With Sub-400 pW Leakage for Ultra-Low Duty Cycles," IEEE Journal of Solid-State Circuits 51.6 (2016): 1331-1346.

Pereira, "All-Digital Phase Locked Loop for Bluetooth Low Energy Transmitters," Proc Conf. on Design of Circuits and Integrated Systems, San Sebastian, Spain, vol. 1, pp. 1-4, Nov. 2013.

\* cited by examiner

FIG. 6

# WATCH-CRYSTAL-BASED RF TRANSMITTER

FIELD

The present disclosure generally relates to wireless transmitters, and more specifically, to low cost wireless transmitters for low power applications.

BACKGROUND

A wireless transmitter, such as a radio frequency (RF) transmitter, generally uses a high frequency crystal oscillator to provide a reference frequency with low phase noise and high stability for RF signal transmission. However, the high frequency crystal oscillator may consume more power than a low frequency crystal oscillator. In addition, the wireless transmitter generally also uses a time base, such as a 32.768 kHz watch crystal, for determining the current time.

SUMMARY

Techniques disclosed herein relate to watch-crystal-based RF transmitters. For example, one disclosed RF transmitter may include an RF oscillator, a real-time clock (RTC) oscillator, and a control circuit. The control circuit may be configured to electrically couple the RF oscillator to the RTC oscillator, initiate calibrating of the RF oscillator using the RTC oscillator, and activate the RF oscillator to operate in an open-loop mode to generate an RF signal for data transmission.

In some implementations of the RF transmitter, the RTC oscillator may be configured to generate a 32.768 kHz signal using a watch crystal. In some implementations, the RF oscillator may include an inductor-capacitor (LC) voltage-controlled oscillator (VCO) or an LC digitally-controlled oscillator (DCO).

In some implementations of the RF transmitter, when the RF oscillator is coupled to the RTC oscillator, the RF oscillator and the RTC oscillator form at least a part of a closed phase-locked loop or a closed frequency-locked loop. The calibrating of the RF oscillator using the RTC oscillator may be performed using the closed loop, and the control circuit may be configured to activate the RF oscillator to operate in the open-loop mode after the calibrating of the RF oscillator using the RTC oscillator.

In some implementations, the RF transmitter may further include a temperature sensor arranged to measure a temperature of the RF oscillator, where the control circuit may be further configured to obtain an operating temperature of the RF oscillator from the temperature sensor, and determine whether a calibration of the RF oscillator is needed based on at least one of the operating temperature of the RF oscillator or an elapsed time since the RF oscillator was last calibrated at the operating temperature. In some implementations, the control circuit may be configured to initiate the calibrating of the RF oscillator using the RTC oscillator based on the operating temperature and for a target frequency of the RF oscillator.

In some implementations, the RF transmitter may further include a memory for storing a calibration table, where the calibration table may include one or more entries, each entry comprising a calibration temperature, a calibration time, and one or more calibration coefficients for the RF oscillator. In some implementations, each entry of the calibration table may further include a target frequency of the RF oscillator, and the calibration table may include entries for one or more target frequencies of the RF oscillator. In some implementations, the control circuit may be further configured to determine that the calibration of the RF oscillator is needed in response to a determination of at least one of: (1) the calibration table does not include an entry corresponding to the operating temperature, or (2) an entry in the calibration table corresponding to the operating temperature indicates an elapsed time greater than a threshold time value. In some implementations, the determination that the calibration table does not include an entry corresponding to the operating temperature may include determining that the operating temperature differs from the calibration temperature of any entry in the calibration table by more than a threshold temperature value.

In some implementations of the RF transmitter, the control circuit may be configured to, in response to the calibrating of the RF oscillator using the RTC oscillator, update the calibration table based on the operating temperature, a calibration time, and one or more calibration coefficients determined by the calibration. In some implementations, the control circuit may be further configured to identify an entry in the calibration table corresponding to the operating temperature of the RF oscillator, and apply the one or more calibration coefficients in the identified entry to the RF oscillator.

In some implementations, the RF transmitter may further include a data injection circuit configured to modulate the RF oscillator with data to be transmitted. The data injection circuit may include a frequency shift keying (FSK) modulator or a Gaussian FSK modulator. In some implementations, the RF transmitter may include a power amplifier coupled to the RF oscillator, and a data injection circuit configured to modulate a gain of the power amplifier using data to be transmitted.

In some implementations, the RF transmitter may further include a background calibration circuit. The control circuit may be configured to electrically couple the RF oscillator to the RTC oscillator by coupling an output of the RF oscillator and an output of the RTC oscillator to the background calibration circuit, and initiate calibrating of the RF oscillator using the RTC oscillator by the background calibration circuit in the open-loop mode. The background calibration circuit may be configured to determine, using the RTC oscillator, a center frequency of the RF signal generated by the RF oscillator, and compare the determined center frequency with a target frequency of the RF oscillator.

Another disclosed wireless transmitter may include an LC oscillator, an RTC oscillator selectively couplable to the LC oscillator, and a control circuit in communication with the LC oscillator and the RTC oscillator. The control circuit may be configured to obtain an operating temperature of the LC oscillator from a temperature sensor, and determine whether a calibration of the LC oscillator is needed based on at least one of: the operating temperature of the LC oscillator or an elapsed time since the LC oscillator was last calibrated at the operating temperature. The control circuit may be further configured to, in responsive to a determination that the calibration of the LC oscillator is needed, electrically couple the RTC oscillator to the LC oscillator to form a closed loop, and initiate calibrating of the LC oscillator using the RTC oscillator in the closed loop. In some implementations, the RTC oscillator may be configured to generate a 32.768 kHz signal using a watch crystal.

In some implementations of the wireless transmitter, the control circuit may be further configured to, in responsive to a determination that the calibration of the LC oscillator is not needed, keep the RTC oscillator disconnected from the LC oscillator, and activate the LC oscillator to generate an RF signal for data transmission while the RTC oscillator remains disconnected from the LC oscillator.

In some implementations, the wireless transmitter may further include a frequency modulator configured to generate tuning codes to modulate the LC oscillator based on data to be transmitted. The frequency modulator may include a frequency shift keying modulator or a Gaussian FSK modulator.

In some implementations, the wireless transmitter may further include a memory device for storing a calibration table, where the calibration table may include one or more entries, each entry comprising a calibration temperature, a calibration time, and one or more calibration coefficients for the LC oscillator. The control circuit may be further configured to search the calibration table to identify an entry in the calibration table corresponding to the operating temperature of the LC oscillator. When no entry corresponding to the operating temperature of the LC oscillator can be found in the calibration table, the control circuit may determine that the calibration is needed. When an entry corresponding to the operating temperature of the LC oscillator is identified in the calibration table, the control circuit may determine an elapsed time based on the calibration time in the entry, and, in responsive to determining that the elapsed time exceeds a threshold time value, determine that the calibration is needed; otherwise, determine that the calibration is not needed. The control circuit may further be configured to, after the calibration is performed, update the calibration table to include an entry with the operating temperature, a time of the calibration, and one or more calibration coefficients determined by the calibration. In some implementations, an entry in the calibration table may correspond to the operating temperature when the operating temperature differs from the calibration temperature of the entry by less than a threshold temperature value.

In some implementations of the wireless transmitter, the control circuit may further be configured to activate the LC oscillator to generate an RF signal for data transmission. In some implementations, the control circuit may further be configured to identify an entry in the calibration table corresponding to the operating temperature of the LC oscillator and indicating an elapsed time no greater than the threshold time value, and apply the one or more calibration coefficients in the identified entry to the LC oscillator.

One disclosed example method may include receiving a request to transmit data using an RF signal; obtaining an operating temperature of an LC oscillator for generating the RF signal; and determining whether a calibration of the LC oscillator for generating the RF signal at a target frequency is needed based on at least one of the operating temperature of the LC oscillator or an elapsed time since the LC oscillator was last calibrated at the operating temperature. The example method may further include, in responsive to a determination that the calibration of the LC oscillator is needed, electrically coupling an RTC oscillator to the LC oscillator and initiating calibrating of the LC oscillator at the operating temperature using the RTC oscillator. The example method may further include activating the LC oscillator to generate the RF signal for data transmission. In some implementations, the RTC oscillator may be configured to generate a 32.768 kHz signal using a watch crystal.

In some implementations of the method, determining whether the calibration of the LC oscillator is needed may include searching a calibration table including one or more entries, each entry comprising a calibration temperature, a calibration time, and one or more calibration coefficients for the RF oscillator; and determining that the calibration of the LC oscillator is needed in response to a determination of at least one of: (1) the calibration table does not include an entry corresponding to the operating temperature, or (2) an entry in the calibration table corresponding to the operating temperature indicates an elapsed time greater than a threshold time value.

In some implementations, the method may further include updating the calibration table after the calibration is performed. In some implementations, activating the LC oscillator to generate the RF signal for data transmission may include identifying an entry in the calibration table corresponding to the operating temperature and indicating an elapsed time no greater than the threshold time value, and applying the one or more calibration coefficients in the identified entry to the LC oscillator.

These illustrative examples are mentioned not to limit or define the scope of this disclosure, but rather to provide examples to aid understanding thereof. Illustrative examples are discussed in the Detailed Description, which provides further description. Advantages offered by various examples may be further understood by examining this specification.

BRIEF DESCRIPTION OF THE DRAWINGS

The accompanying drawings, which are incorporated into and constitute a part of this specification, illustrate one or more certain examples and, together with the description of the example, serve to explain the principles and implementations of the certain examples.

DETAILED DESCRIPTION

Examples are described herein in the context of a low cost radio frequency (RF) transmitter for low power applications. Those of ordinary skill in the art will realize that the following description is illustrative only and is not intended to be in any way limiting. Reference will now be made in detail to implementations of examples as illustrated in the accompanying drawings. The same reference indicators will be used throughout the drawings and the following description to refer to the same or like items.

In the interest of clarity, not all of the routine features of the examples described herein are shown and described. It will, of course, be appreciated that in the development of any such actual implementation, numerous implementation-specific decisions must be made in order to achieve the developer's specific goals, such as compliance with application- and business-related constraints, and that these specific goals will vary from one implementation to another and from one developer to another.

In one illustrative example, a wireless transmitter uses an open-loop inductor-capacitor (LC) oscillator, such as a voltage-controlled oscillator (VCO) or a digitally-controlled oscillator (DCO), to synthesize wireless transmissions. In this example, the wireless transmitter uses a single low frequency crystal oscillator both for keeping track of current time for the wireless transmitter and for calibrating the LC oscillator in a closed-loop mode. The wireless transmitter transmits data using the LC oscillator and re-calibrates the LC oscillators frequency, when needed, using a low-frequency watch crystal.

This example wireless transmitter includes a control circuit that maintains calibration information and determines whether a calibration of the LC oscillator is needed. When it is determined that a calibration of the LC oscillator is needed, the control circuit switches the wireless transmitter to a closed-loop calibration mode. In this example, the control circuit can be implemented as a dedicated circuit or using a processor executing corresponding software. The control circuit monitors the operating temperature of the LC oscillator and a time since the last calibration occurred. For example, when the operating temperature of the LC oscillator has changed sufficiently, or when the calibration data has expired, the control circuit will couple the watch-crystal oscillator to the LC oscillator to calibrate the LC oscillator. By only selectively calibrating the LC oscillator at particular times, and otherwise using the LC oscillator in an open-loop mode, the potential longer settling time associated with the calibration using the low frequency crystal oscillator may be acceptable.

A wireless transmitter, such as an RF transmitter, may include, for example, a phase-locked loop (PLL) or a frequency-locked loop (FLL) that uses a crystal oscillator as a temperature-stable reference frequency to generate RF signals with low phase noise. Spectral purity of the PLL output is usually specified by the phase noise and the level of the reference-related spurs ("reference spurs"). There may be many other parameters to consider when designing a PLL or FLL, such as the input RF frequency range, channel spacing, pre-scaler parameters, and loop bandwidth, etc. Since the PLL is a negative feedback system, phase margin and stability issues must be considered as well.

Many of the above PLL parameters are interactive. For example, the noise performance of the PLL output may depend on the loop bandwidth. A large loop bandwidth may help to improve the phase noise in the close-in band and reduce the PLL settling time, but may not sufficiently suppress reference spurs, while a lower loop bandwidth may lead to reduced levels of reference spurs, but at the expense of a longer lock time and less phase margin. As used herein, the terms "lock time" and "settling time" may be used interchangeably. Reference spurs are spurious tones in the PLL's output that occur at multiples of the reference frequency. Reference spurs may degrade the signal-to-noise ratio (SNR) in data reception and transmission in RF transceivers. Reference spurs may result, for example, from periodic disturbances of the loop filter voltage introduced by the charge pump. The loop bandwidth and the reference frequency both affect the power levels of the reference spurs. Increasing the loop bandwidth for a given reference frequency or decreasing the reference frequency for a given loop bandwidth both have the effect of reducing the loop filter's attenuation of the disturbances, thereby increasing the power levels of the reference spurs. Therefore, a tradeoff between the loop bandwidth, noise levels, reference spur levels, reference frequency, and settling time has to be considered when designing a PLL.

In an RF transmitter, a high frequency crystal oscillator at about 10 MHz or higher may be used as the reference signal source such that reference spurs may fall outside the loop bandwidth or be sufficiently suppressed by a loop filter with a relative high loop bandwidth for reduced settling time. However, the high frequency crystal oscillator may consume significantly more power than a low frequency crystal oscillator.

In addition, a wireless transmitter generally also uses a low frequency time base as a real-time clock (RTC) for determining the current time. RTCs often have alternate sources of power, such as lithium batteries, so that they can continue to keep track of time while a primary source of power is off or unavailable.

While a frequency of an RTC may vary with the application, in many cases, the frequency of the RTC is 32.768 kHz, which is the frequency used in quartz clocks and watches. Such a RTC has exactly $2^{15}$ cycles per second, which can be used by a simple binary counter circuit to get a precise 1-second period (1 Hz frequency). This frequency is also selected as a compromise among cost, market availability, and required real estate in terms of physical dimensions on circuit boards because a low frequency quartz crystal is usually physically larger, but may consume less power than a higher-frequency oscillator.

Using two crystals in the wireless transmitter may increase the cost, power consumption, and physical dimensions of the wireless transmitter. Therefore, it may be desirable to remove one of the crystal oscillators. In some wireless transmitters, due to, for example, lock time, phase noise, and reference spur requirements, a high frequency crystal oscillator at about 10 MHz or higher may be used as the reference signal for frequency, phase, or delay lock, and may be used to generate low frequency signals to provide RTC functionality, even though the high frequency crystal oscillator may consume more power than a low frequency crystal oscillator. However, in many applications, such as portable devices, wearable devices, or some medical devices, the power consumption is generally reduced as much as possible to preserve battery life. Thus, using a high frequency crystal in such applications may significantly reduce the battery life, while a low frequency crystal may not meet the settling time and phase noise requirements of the wireless transmission applications.

Disclosed herein are wireless transmitters that use a single low frequency crystal oscillator, such as a 32.768 kilohertz (kHz) watch crystal, both for keeping track of current time for the wireless transmitter and for providing a reference clock for calibrating a high frequency integrated oscillator that generates RF signals for transmission. In one illustrative example of a watch-crystal-based RF transmitter, the RF transmitter includes an inductor-capacitor (LC) oscillator, such as a voltage-controlled oscillator (VCO) or a digitally-controlled oscillator (DCO), to synthesize RF signals for open-loop wireless transmissions. The RF transmitter operates in an open-loop mode during RF transmissions in this example because its frequency is not calibrated during every transmission. Instead, to calibrate the LC oscillator's operating frequency, the RF transmitter closes a calibration loop to include the low-frequency oscillator as a reference signal source.

To perform the calibration, this example wireless transmitter includes a control circuit to determine whether a calibration of the LC oscillator is needed before a data transmission session, and switch the wireless transmitter to the closed-loop calibration mode when the calibration is needed, for example, when the operating temperature of the LC oscillator has changed or that the existing calibration data has expired. Because the calibration of the LC oscillator is not performed each time data is transmitted, a potential longer settling time associated with the calibration using the low frequency crystal oscillator may be acceptable. Furthermore, because the wireless transmitter may operate in an open-loop mode when transmitting the RF signals, the phase noise of the RF signals would likely not be affected by the low frequency crystal oscillator. Therefore, it is possible to use a single low frequency crystal oscillator in a low cost wireless transmitter for low power applications, such as Bluetooth Low Energy (BLE).

In addition, using such an example wireless transmitter, frequency modulation (FM) of a carrier frequency with data to be transmitted can be achieved by modulating the control voltage or tuning codes of the LC oscillator in the open-loop mode. Amplitude modulation (AM) of the carrier signal with data to be transmitted can be achieved by modulating a power amplifier (PA) of the wireless transmitter with data to be transmitted. As discussed above, the temperature sensitivity and long-term drift of the LC oscillator may be calibrated using the low frequency crystal oscillator (e.g., a 32.768 kHz real-time clock) when needed. The calibration may be performed either during the offline calibrations using a PLL or FLL, or online during data packet transmissions. The calibration may help to stabilize the frequency of the LC oscillator, and thus provide an accurate RF center frequency. As used herein, the terms "center frequency" and "carrier frequency" may be used interchangeably.

Figure 1:
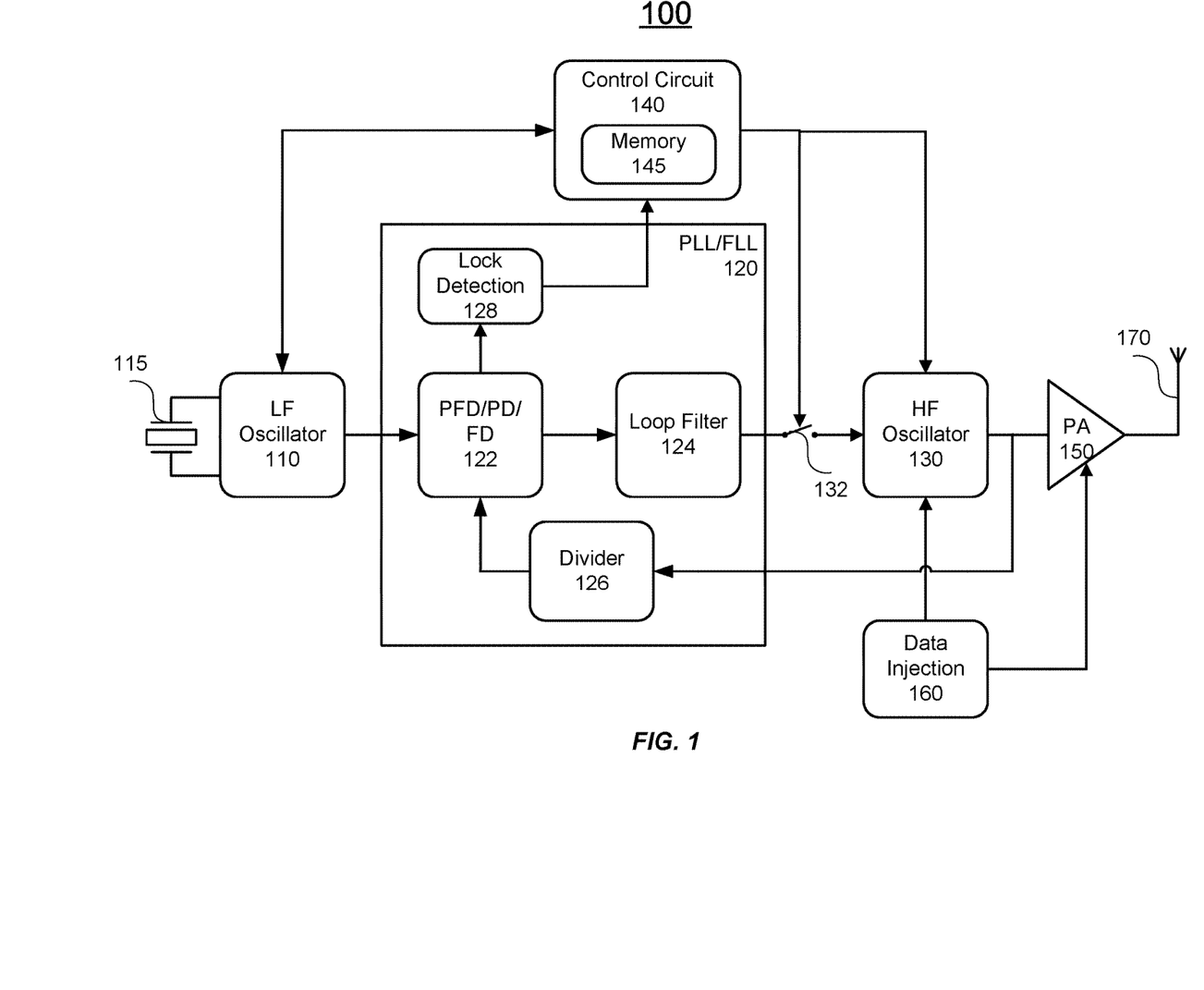
FIG. 1 illustrates a simplified block diagram of an example wireless transmitter, according to certain aspects of the present disclosure.

FIG. 1 illustrates an example wireless transmitter 100, according to certain aspects of the present disclosure. In an example implementation, wireless transmitter 100 may include a low frequency (LF) oscillator 110, a PLL or FLL 120, a high-frequency (HF) oscillator 130, a control circuit 140, a PA 150, a data injection circuit 160, and an antenna 170. One skilled in the relevant art will appreciate that the disclosed illustrative components are not meant to be an exhaustive identification of all the components required by or present in a wireless transmitter. Rather, illustrative components have been identified, in a non-limiting manner, to facilitate illustration of one or more aspects of the present disclosure. Still further, some illustrative components of wireless transmitter 100 may be logical in nature such that the physical implementation of one or more components can be varied. Also note that even though the techniques are described using wireless transmitters as examples, the techniques disclosed herein may be used in a wired transmitter, a wired or wireless receiver, or a wired or wireless transceiver.

LF oscillator 110 may be an oscillator at a frequency below, for example, 1 MHz. LF oscillator 110 may be coupled to an external crystal 115, such as a quartz crystal, as a reference frequency source due to its consistent performance in accuracy and stability. In one implementation, crystal 115 may be a watch crystal at 32.768 kHz that is commonly used in quartz clocks and watches and therefore has a low cost and is readily available. The watch crystal at 32.768 kHz can generate approximately $2^{15}$ cycles per second, which can be used by a simple binary counter circuit to get a precise 1-second period. LF oscillator 110 and crystal 115 may thus provide a low-cost, low power RTC for the wireless transmitter 100. LF oscillator 110 and crystal 115 may also be used to generate a reference signal for other circuits on wireless transmitter 100, such as HF oscillator 130.

PLL/FLL 120 may be an analog PLL/FLL, a digital PLL, or an all-digital PLL/FLL. The following description uses PLLs as examples, but one skilled in the relevant art will understand that the techniques described may be applicable to FLLs. In some examples, PLL/FLL 120 may include a phase detector (PD), frequency detector (FD), or phase frequency detector (PFD) 122, which may be implemented in analog circuits or digital circuits. PFD/PD/FD 122 may compare the phase and/or frequency of a reference signal and a feedback signal derived from the generated oscillation signal, and generate an error signal that represents the difference in phase and/or frequency between the two input signals. As known to one skilled in the art, there may be many ways to implement PFD/PD/FD 122.

The error signal generated by PFD/PD/FD 122 may be filtered by a loop filter 124, such as a low-pass filter. Loop filter 124 may be designed to achieve a desired stability and noise performance. For example, loop filter 124 may be designed based on the range over which the loop can be locked (i.e., pull-in range, lock range, or capture range), how fast the loop can be locked (i.e., lock time, lock-up time, or settling time), and damping behavior. Loop filter 124 may be designed to limit the amount of reference frequency energy appearing in the error signal, which is applied to the oscillator and may cause reference spurs as described above. For example, when a reference signal of 10 MHz is used, loop filter 124 may be designed to have a half-width bandwidth of less than 20 MHz such that the second and higher order harmonics of the reference signal may be attenuated. As also described above, the loop bandwidth of loop filter 124 may be selected to compromise the stability, lock time, and noise performance. For example, reducing the loop bandwidth may reduce the reference spurs but may increase the lock time, increasing the loop bandwidth may reduce the lock time but may increase reference spurs and degrade the stability, while too much damping for better stability may increase the lock time. In implementations where data is transmitted in an open-loop mode, because the reference signal is disconnected from PLL/FLL 120 and loop filter 124 is not used during the data transmission, the RF signal from HF oscillator 130 would likely not be affected by the low frequency reference signal, and thus loop filter 124 may be designed to have a wider bandwidth to reduce the lock time in the closed-loop mode.

The output signal from loop filter 124 may be used to drive HF oscillator 130, such as an LC oscillator, for generating an RF signal at, for example, about 2.402-2.478 GHz in the Bluetooth frequency range, or other frequencies for various wireless or wired communications standards such as Enhanced Digital GSM Evolution (EDGE), extended data rate Bluetooth, Wideband Code Division Multiple Access (WCDMA), Wireless LAN (WLAN), Ultra Wideband (UWB), Orthogonal Frequency Division Multiplex (OFDM), coaxial cable, radar, and optical, etc. The center frequency of HF oscillator 130 may be greater than, for example, 50 MHz, 100 MHz, 500 MHz, 1 GHz, 2 GHz, or higher. HF oscillator 130 may be an oscillator with variable frequency capability controllable by a control voltage or digital code. HF oscillator 130 may be an analog VCO either driven by analog circuitry in the case of an analog PLL or driven digitally through the use of a digital-to-analog converter (DAC) in the case of a digital PLL. HF oscillator 130 may also be a DCO in the case of an all-digital PLL (ADPLL). In some implementations, HF oscillator 130 may be an LC oscillator including, for example, a tunable capacitor or a selectable capacitor bank. The tunable capacitor may be tunable by a voltage signal or a digital code. The selectable capacitor bank may include a plurality of capacitors with same or different capacitance values that can be selectively turned on or off by a digital code.

The RF signal generated by HF oscillator 130 may be divided by a divider 126 and provided as the feedback signal to PFD/PD/FD 122. Divider 126 may divide the RF signal generated by HF oscillator 130 such that the frequency of the feedback signal may be close to the frequency of the reference signal from LF oscillator 110, e.g., the resonant frequency of crystal 115. In some implementations, divider 126 may divide the RF signal by an integer ratio. In some implementations, the reference signal from LF oscillator 110 may be prescaled (divided or multiplied) before it is fed to PFD/PD/FD 122. In some cases, the divide/multiply ratio of the reference signal and the divide ratio of the RF signal may have no common factor greater than one, such that the effective divide ratio may be a fractional number.

Optionally, PLL/FLL 120 may include a lock detection circuit 128 that can generate an alarm signal indicating whether PLL/FLL 120 has been locked. The lock detection alarm signal may be used by, for example, control circuit 140, for controlling the operation of wireless transmitter 100. For example, when the lock detection alarm signal is received by control circuit 140, control circuit 140 may disconnect PLL/FLL 120 from HF oscillator 130 using, for example, a switch 132, to open the loop, and initiate data transmission in the open-loop mode.

In some implementations, HF oscillator 130 may be directly frequency-modulated by the data to be transmitted using data injection circuit 160. In some implementations, a frequency shift keying (FSK) technique or a Gaussian FSK (GFSK) technique may be used to modulate HF oscillator 130 by the data to be transmitted. For example, in some implementations, a varactor may be controlled by a DAC driven by the digital data to perform the GFSK modulation.

PA 150 may amplify the RF signal from HF oscillator 130, and send it to antenna 170 for transmitting to the air. In some implementations, data injection circuit 160 may modulate the amplitude of PA 150 directly using the data to be transmitted by, for example, modulating the gain of PA 150.

Control circuit 140 may be implemented using, for example, a processor and associated memory, an application-specific integrated circuit (ASIC), a field programmable gate array (FPGA), a programmable logic controller (PLC), or a programmable logic device (PLD). Control circuit 140 may control the operation of wireless transmitter 100, including data transmission and calibration of HF oscillator 130. For example, control circuit 140 may store calibration coefficients, which may also be referred to as oscillator tuning words (OTWs), for different operating temperatures in a memory 145, obtain the operating temperature of HF oscillator 130 and determine whether HF oscillator 130 needs to be calibrated before the data transmission, and control the data transmission and/or the calibration of HF oscillator 130 before or during the data transmission. For example, when it is determined that a new calibration is needed, control circuit 140 may connect HF oscillator 130 to LF oscillator 110 and PLL/FLL 120, through switch 132, to calibrate HF oscillator 130 in a closed loop to generate a new calibration coefficient (OTW). When control circuit 140 determines that a new calibration is not needed, it may keep HF oscillator 130 disconnected from LF oscillator 110 and PLL/FLL 120 such that HF oscillator 130 is controlled by a stored calibration coefficient and operates in an open-loop mode for data transmission, during which LF oscillator 110 and PLL/FLL 120 may be reset or powered off to reduce power consumption. In some implementations, a background calibration may be performed in an open-loop mode when data is transmitted as described in detail below.

As such, wireless transmitter 100 only performs calibration of HF oscillator 130 when a calibration is required, rather than each time data is transmitted, and thus, the calibration can be performed using the watch-crystal-based LF oscillator 110, which may result in a long lock time, without affecting the performance of wireless transmitter 100. Embodiments of control circuit 140, the associated circuits, and their operations are described in detail below with respect to FIGS. 2-7.

Figure 2A:
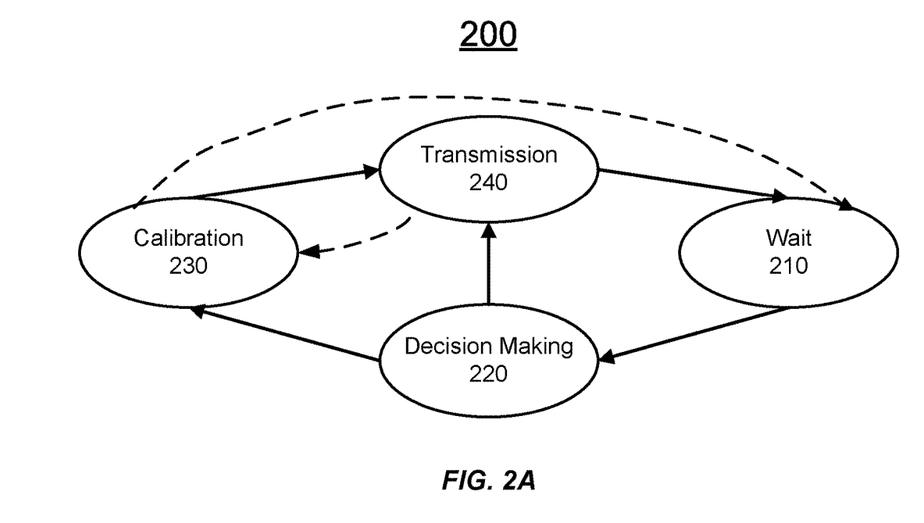
FIG. 2A shows an example state machine of a wireless transmitter, according to certain aspects of the present disclosure.

FIG. 2A shows an example state machine 200 of a wireless transmitter, such as wireless transmitter 100 of FIG. 1, according to certain aspects of the present disclosure. As shown in FIG. 2A, at wait state 210, the wireless transmitter is waiting for a new request to transmit data, during which time the wireless transmitter is neither transmitting data nor calibrating the HF oscillator, and thus at least some portions of the wireless transmitter may be in low-power or sleep mode. When a new request to transmit data is received, the wireless transmitter may activate at least some of the portions of the wireless transmitter that are in low-power or sleep mode, and enter decision-making state 220.

At decision-making state 220, a control circuit of the wireless transmitter, such as control circuit 140 of FIG. 1, may determine whether to calibrate the HF oscillator or, in response to data that is ready to transmit, transmit data. For example, at decision-making state 220, the control circuit may determine whether a new calibration is needed based on, for example, a monitored operating temperature of the LC oscillator and calibration coefficients for different operating temperatures stored in a memory. For example, if the calibration coefficient for the LC oscillator at a temperature sufficiently close to the current operating temperature of the LC oscillator is stored in the memory, the control circuit may use the stored calibration coefficient to tune the LC oscillator. A temperature may be sufficiently close to the current operating temperature if it differs from the current operating temperature by, for example, less than 1° C., 0.5° C., 0.1° C., or less.

In some implementations, the control circuit may also determine the elapsed time since the LC oscillator was last calibrated at a temperature sufficiently close to the current operating temperature based on the information stored in the memory, such as the last calibration time, and the current time determined based on the real-time clock. If the elapsed time is less than a threshold value, such as, for example, 0.1 second, 0.5 second, 1 second, 2 seconds, 5 seconds, or longer, the control circuit may determine that no new calibration is needed, and the state machine may proceed to transmission state 240 for transmitting the new data packets. If no calibration coefficient in the memory corresponds to a temperature sufficiently close to the current operating temperature, or if the elapsed time since the last calibration at or near the current operating temperature is longer than the threshold value (i.e., the calibration coefficient has expired), the control circuit may determine that a calibration of the LC oscillator is needed and the state machine may proceed to calibration state 230 for a new calibration, the results of which may be stored in the memory. In some embodiments, if no calibration coefficient in the memory corresponds to a temperature sufficiently close to the current operating temperature, a calibration coefficient may be calculated based on available calibration coefficients for different operating temperatures, for example, by a linear or nonlinear interpolation.

When the wireless transmitter transitions to calibration state 230 after a decision is made at decision-making state 220 that a new calibration is needed, an HF oscillator, such as an LC oscillator, may be calibrated and frequency- and/or phase-locked to a reference signal, such as a 32.768 kHz real-time clock, by coupling the reference signal source, for example, the RTC, to the HF oscillator. This calibration may generate an LC tuning/calibration coefficient (or OTW), which may tune the oscillating frequency of the LC oscillator to a specific RF channel. The LC oscillator may be calibrated to tune the oscillating frequency to different frequency channels separated by a predetermined frequency band, and the calibration coefficients for the different frequency channels may be saved in a memory, such as memory 145 of FIG. 1. In some implementations, the LC oscillator may be tuned to different frequency channels using calibration coefficients separated by known or predetermined values without actually calibrating the LC oscillator for all frequency channels.

After the LC oscillator is calibrated, the wireless transmitter may transition to transmission state 240, and the LC oscillator may be controlled by the calibration coefficient to generate the RF signal at the desired frequency, which may then be modulated and transmitted during transmission state 240. As discussed above, in some embodiments, the calibration may be performed in a closed loop during a period when the wireless transmitter is not transmitting. Thus, after performing the calibration, the control circuit may decouple the reference frequency source from the HF oscillator such that open-loop transmission may be performed.

If a decision is made at decision-making state 220 that a new calibration is not needed, the wireless transmitter may transition to transmit state 240 from decision-making state 220 without going through calibration state 230, and the control circuit may apply a calibration coefficient to the LC oscillator to maintain the center frequency of the RF signal with sufficiently low frequency drift during, for example, the 376 μs BLE packet transmission session, and to ensure that the center frequency drift is within tolerances for a particular wireless transmission protocol, e.g., within the BLE specification of ±20 ppm. After completing the transmission, the wireless transmitter transitions back to wait state 210.

As described in detail below, in some implementations, when it is determined that calibrations are need, open-loop background calibrations may be performed during transmission state 240, rather than the closed-loop foreground calibrations performed before data transmission as described above. In implementations where the background calibration is performed during transmission state 240, when data transmission at transmission state 240 is complete, state machine 200 may transition back to calibration state 230. During calibration state 230, the control circuit may then determine whether the background calibration is complete and store any calibration parameters determined during the background calibration to memory, before state machine 200 transitions back to wait state 210.

Figure 2B:
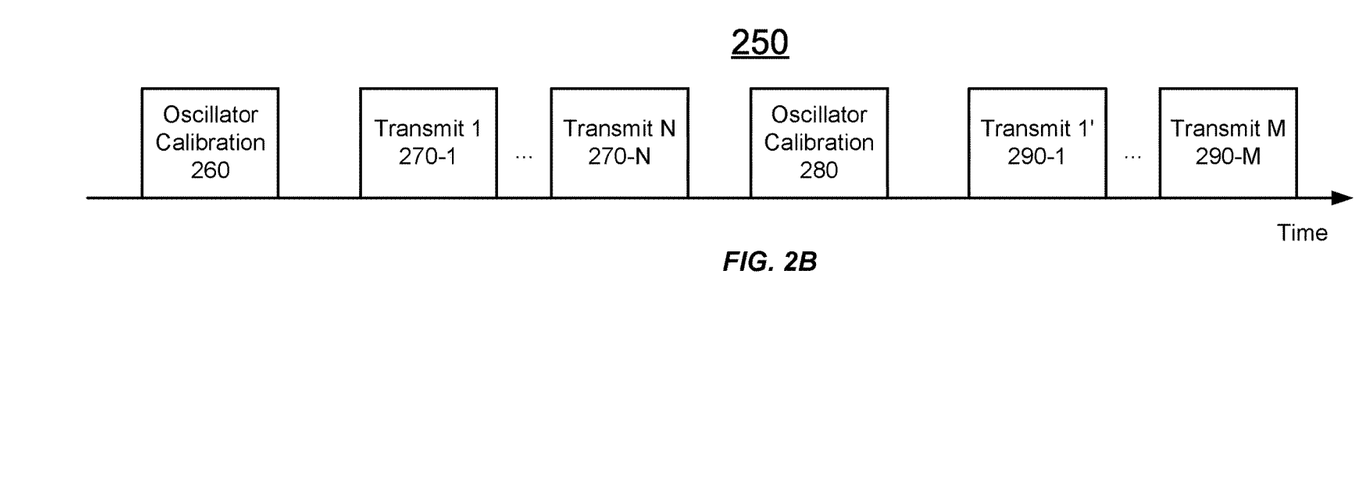
FIG. 2B shows the state of a wireless transmitter at different times, according to certain aspects of the present disclosure.

FIG. 2B shows the state of an example wireless transmitter at different times, according to certain aspects of the present disclosure. For example, the wireless transmitter may perform an oscillator calibration session 260, and transmit data in a transmit session 270-1 (Transmit 1). The wireless transmitter, more specifically, a control circuit of the wireless transmitter, may determine that the LC oscillator does not need to be recalibrated after receiving the next request to transmit data, and may transmit data packets in the next transmit session using a calibration coefficient stored in the memory or a calibration coefficient calculated using calibration coefficients stored in the memory. The wireless transmitter may continue to receive requests for data transmission and transmit data packets without recalibrating the LC oscillator if it is determined that no calibration is needed before the data transmission. After transmit session 270-N (Transmit N), the wireless transmitter may receive another request to transmit data. Before transmitting data in a new transmit session 290-1 (Transmit 1'), the wireless transmitter may determine that the LC oscillator needs to be calibrated because, for example, the operating temperature of the LC oscillator has changed or the calibration coefficient has expired. An oscillator calibration session 280 may be performed before transmit session 290-1 (Transmit 1'). Afterwards, M−1 transmit sessions may be performed until a transmit session 290-M (Transmit M) without recalibrating the LC oscillator. In this way, the number of LC oscillator calibration sessions, the time spent for the LC oscillator calibration, and the power consumed during the LC oscillator calibration may be reduced significantly.

Figure 3:
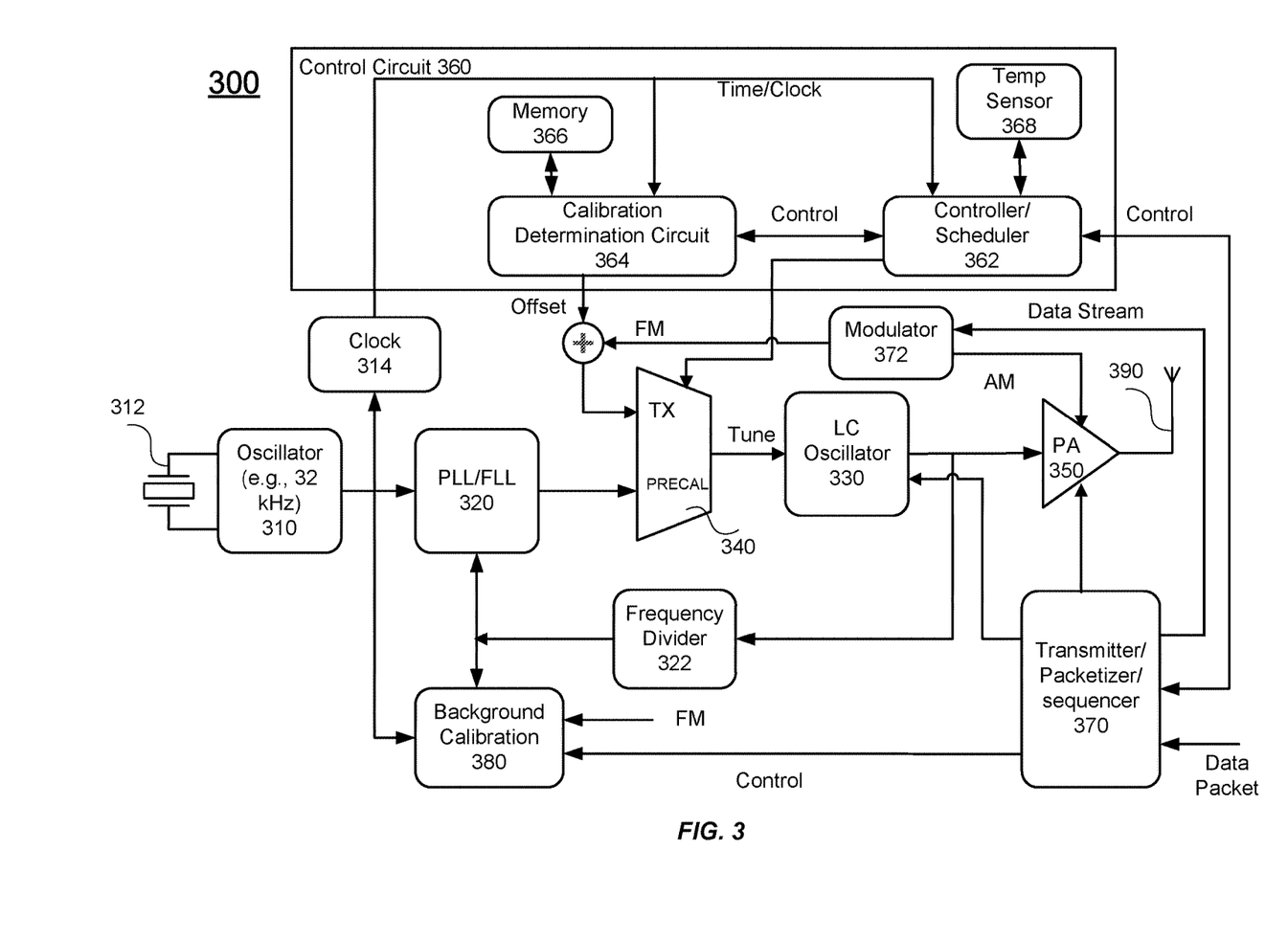
FIG. 3 illustrates a more detailed block diagram of an example wireless transmitter, according to certain aspects of the present disclosure.

FIG. 3 illustrates a more detailed block diagram of an example wireless transmitter 300 according to certain aspects of the present disclosure. One skilled in the relevant art will appreciate that the disclosed illustrative functional blocks in FIG. 3 are not meant to be an exhaustive identification of all the functional blocks required by or present in a programmable security logic. Rather, illustrative functional blocks have been identified, in a non-limiting manner, to facilitate illustration of one or more aspects of the present application. Still further, the illustrative functional blocks of wireless transmitter 300 may be logical in nature such that the physical implementation of one or more functional blocks can be varied. In various implementations, some of the illustrated functional blocks may be omitted, combined with other functional blocks, or split into multiple functional blocks, without deviating from the scope of the present disclosure.

As shown in FIG. 3, wireless transmitter 300 may include an oscillator 310, a crystal 312 connected to oscillator 310, a PLL/FLL 320, a frequency divider 322, an LC oscillator 330, a PA 350, and an antenna 390. Oscillator 310 and crystal 312 may be similar to LF oscillator 110 and crystal 115 of FIG. 1, respectively, and may generate a real-time clock signal at, for example, 32.768 kHz. The real-time clock signal may be used by a clock circuit 314 to determine the current time. PLL/FLL 320 may be similar to PLL/FLL 120 of FIG. 1, and may be used in a closed loop to calibrate LC oscillator 330 using the real-time clock signal as a reference signal. Frequency divider 322 may be similar to divider 126 of FIG. 1. As in FIG. 1, wireless transmitter 300 may also include a prescaler (not shown) for multiplying or dividing the real-time clock reference signal. LC oscillator 330 may be similar to LC oscillator 130 of FIG. 1, and may include a VCO or a DCO. PA 350 and antenna 390 may be similar to PA 150 and antenna 170 of FIG. 1, respectively.

Wireless transmitter 300 may also include a transmitter/packetizer/sequencer 370 configured to receive data to be transmitted, packetize the data, and send the packetized data to a modulator 372 for frequency or amplitude modulation. Transmitter/packetizer/sequencer 370 may be implemented using, for example, a processor and associated memory, an ASIC, an FPGA, a PLC, or a PLD. Modulator 372 may include a frequency modulator, such as an FSK modulator that can decrease the carrier frequency for the duration of a "0" symbol and increase the frequency for the duration of a "1" symbol, or a GFSK modulator which may include a finite impulse response (FIR) filter that applies Gaussian filtering to a square-wave signal to shift the carrier frequency. Alternatively or additionally, modulator 372 may include an amplitude modulator that can be used to modulate the amplitude of the RF signal at PA 350. Transmitter/ packetizer/sequencer 370 may also determine when to activate LC oscillator 330 and PA 350 for frequency or amplitude modulation and data transmission, and control LC oscillator 330 and PA 350 accordingly, based on, for example, a control signal received from a control circuit of wireless transmitter 300 as described below.

Wireless transmitter 300 may also include a control circuit 360. Control circuit 360 may include a controller/scheduler 362 acting as the main controller of control circuit 360. Controller scheduler 362 may be implemented using, for example, a processor and associated memory, an ASIC, an FPGA, a PLC, or a PLD. Controller/scheduler 362 may receive time information from clock circuit 314 and requests to transmit data from transmitter/packetizer/sequencer 370. Control circuit 360 may include or be connected to a temperature sensor 368 configured to measure the operating temperature of LC oscillator 330. Temperature sensor 368 may include, for example, a resistance temperature detector (RTD), a thermistor, a semiconductor thermal diode, a semiconductor thermal transistor, or any other temperature sensor known to a person skilled in the art. Upon receiving a request to transmit data, controller/scheduler 362 may send the time information and the operating temperature of LC oscillator 330 to a calibration determination circuit 364.

Calibration determination circuit 364 may be connected to a memory 366, such as a cache. Memory 366 may store calibration coefficients from previously performed calibrations, the corresponding operating temperatures, and the times when the corresponding calibrations were performed, in a calibration table. The calibration table may include one or more entries, where each entry may include a calibration coefficient, a calibration time, and a calibration temperature. In some embodiments where calibrations are done for different target frequencies of the LC oscillator, the one or more entries may include entries for different target frequencies, and each entry may also include a corresponding target frequency. Based on the time information and the operating temperature of LC oscillator 330 received from controller/ scheduler 362 and the calibration information stored in memory 366, calibration determination circuit 364 may determine whether a calibration is needed as described above with respect to control circuit 140 of FIG. 1 and decision-making state 220 of FIG. 2 and described below with respect to FIG. 4, and if not, what calibration coefficient (OTW or offset) to apply to LC oscillator 330 during the data transmission.

If it is determined that a calibration is not needed, calibration determination circuit 364 may send a control signal to inform controller/scheduler 362, which may in turn send a control signal to transmitter/packetizer/sequencer 370 such that transmitter/packetizer/sequencer 370 may control LC oscillator 330 and/or PA 350 for data transmission. During the data transmission, transmitter/packetizer/sequencer 370 may in turn send a data stream to modulator 372, which may generate corresponding FM tuning words that can be added to the calibration coefficient and sent to LC oscillator 330, through a TX port of a multiplexer 340, for controlling LC oscillator 330 to generate a frequency-modulated RF signal for transmission.

If it is determined that a calibration is needed, calibration determination circuit 364 may inform controller/scheduler 362, which may then control the multiplexer 340 to close a calibration loop by connecting oscillator 310 and PLL/FLL 320 to LC oscillator 330 through a PRECAL port of multiplexer 340. During the calibration, the appropriate calibration coefficient that can tune LC oscillator 330 to a desired frequency may be determined by tuning the calibration coefficient reiteratively until the desired frequency is achieve. After the calibration is done, the determined calibration coefficient may then be saved to memory 366 and be used in combination with the FM tuning words from modulator 372 to modulate LC oscillator 330 for data transmission.

In some embodiments, wireless transmitter 300 may include a background calibration circuit 380 that may calibrate LC oscillator online while the LC oscillator is modulated by a calibration coefficient and the FM tuning words for transmitting data in an open-loop mode. In the open-loop mode, PLL/FLL 320 may be disconnected from LC oscillator 330, and background calibration circuit 380 may be coupled to the output of LC oscillator 330 and the output of oscillator 310 (the real-time clock). Background calibration circuit 380 may include a digital or analog frequency counter, and may be implemented using, for example, a processor and associated memory, an ASIC, an FPGA, a PLC, or a PLD. Background calibration circuit 380 may receive the FM tuning words from modulator 372 and/or data from the transmitter/packetizer/sequencer 370 and estimate an average frequency offset of the frequency modulation based on the FM tuning words or the data as described in detail below. Background calibration circuit 380 may also measure an average frequency of the output signal from LC oscillator 330 using the frequency counter and using the real-time clock as a clock or reference signal, and estimate a center frequency of LC oscillator 330 based on the estimated average frequency offset and the measured average frequency of the output signal from LC oscillator 330. Background calibration circuit 380 or control circuit 360 may then compare the desired center frequency of the output signal of LC oscillator 330 with the estimated center frequency of LC oscillator 330, and determine whether the calibration coefficient is valid based on a difference between the desired center frequency and the estimated center frequency.

In some implementations, if it is determined that the calibration coefficient is invalid when, for example, the difference between the desired center frequency and the estimated center frequency is greater than a threshold value (e.g., ±20 ppm of the desired center frequency), background calibration circuit 380 may send a request for an offline closed-loop calibration. In some implementations, if it is determined that the calibration coefficient is invalid, background calibration circuit 380 may apply a new calibration coefficient in the next data transmission session in the open-loop mode and measure the average frequency of the output signal of LC oscillator 330 using the real-time clock as a clock or reference signal, until a valid calibration coefficient is determined. Example processes of wireless transmitter calibration (including background calibration) and data transmission are described in detail below.

Figure 4:
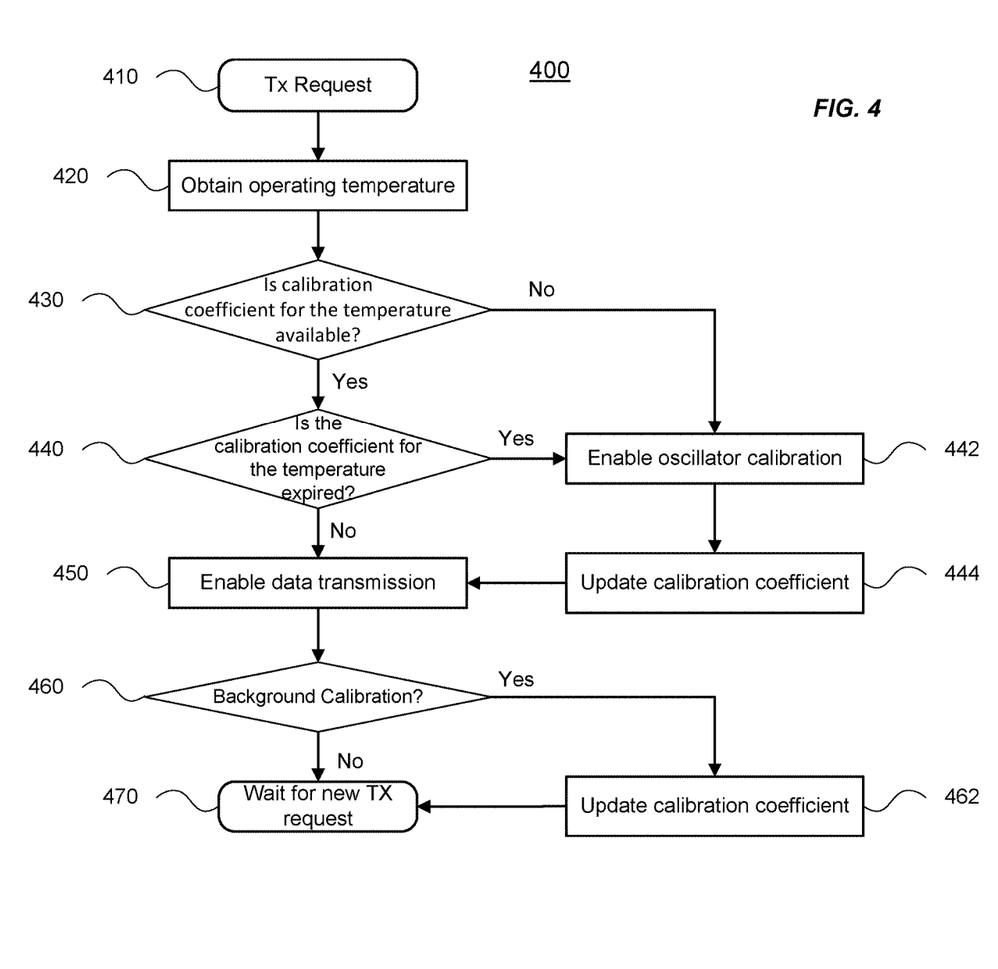
FIG. 4 is a flow chart illustrating an example process of wireless transmitter calibration and data transmission, according to certain aspects of the present disclosure.

FIG. 4 is a flow chart illustrating an example process 400 of wireless transmitter calibration and data transmission, according to certain aspects of the present disclosure. In a typical wireless transmitter, an RF oscillator, such as an LC oscillator, may need to be calibrated to set the center frequency of the RF oscillator to a desired frequency before any data transmission. As described in this disclosure, calibration data can be saved to reduce the number of calibrations during the operation of the wireless transmitter such that the impact of the calibration time may be minimized, and, as such, a low frequency reference signal, such as a 32.768 kHz real-time clock signal (which may result in long lock time), may be used for calibration.

At block 410, a control circuit, such as control circuit 140 of FIG. 1 or control circuit 360 of FIG. 3, may receive a request to transmit data from, for example, transmitter/packetizer/sequencer 370. Before a transmission session is started, the control circuit may determine if a calibration of the RF oscillator is needed.

At block 420, the control circuit may obtain the current operating temperature of the RF oscillator using, for example, temperature sensor 368 of FIG. 3. The accuracy of the temperature sensor and the time period for measuring the current operating temperature may be determined, for example, based on the temperature stability of the RF oscillator and the allowable latency of the data transmission.

At block 430, the control circuit may determine whether a calibration coefficient is available for the current operating temperature in a memory that stores information regarding previously performed calibrations. For example, if the current operating temperature of the LC oscillator is sufficiently close (e.g., within 0.1° C. or less) to the calibration temperature of a previously saved calibration, the corresponding calibration coefficient of the matching calibration may be used to tune the LC oscillator for the requested data transmission. In some embodiments, depending on the predetermined or dynamically measured (e.g., using background calibration circuit 380) stability of the LC oscillator, the allowable temperature variation without requiring a new calibration may be different. Furthermore, techniques such as interpolations may be used to determine the calibration coefficient for a current operating temperature even if no previous calibration data is available for the current operating temperature or a temperature sufficiently close to the current operating temperature. If it is determined that the calibration coefficient for the current operating temperature is available in the memory or can be calculated based on calibration coefficients stored in the memory, the control circuit may proceed to block 440. Otherwise, the control circuit may proceed to block 442.

At block 440, the control circuit may determine whether the calibration coefficient for the current operating temperature has expired. As described above, the calibration information stored in the memory may include the time when the calibration was performed. The control circuit may determine the elapsed time since the calibration was last performed. If the elapsed time is longer than a threshold value, the corresponding calibration coefficient may have expired, and a new calibration may be needed at block 442. Otherwise, a calibration may be skipped, and the control circuit may proceed to block 450.

At block 442, the control circuit may enable the RF oscillator calibration by, for example, connecting a reference oscillator (e.g., oscillator 310 of FIG. 3) and a PLL or FLL (e.g., PLL/FLL 320 of FIG. 3) to the RF oscillator through, for example, multiplexer 340 of FIG. 3, to form a closed loop. The RF oscillator may then be calibrated to generate the desired center frequency, and the tuning code used to set the RF oscillator to generate the desired center frequency may be determined as the corresponding calibration coefficient, which may then be saved to, for example, memory 366 of FIG. 3, along with the calibration temperature and time at block 444.

At block 450, the control circuit may enable the data transmission in an open-loop mode by disconnecting the reference oscillator and the PLL/FLL and enabling data transmission circuits, such as, for example, modulator 372, LC oscillator 330, PA 350, and transmitter/packetizer/sequencer 370 of FIG. 3. The calibration coefficient determined at block 430 or 442 may be used along with the tuning codes for frequency modulation determined by, for example, modulator 372, to tune the RF oscillator for generating frequency-modulated RF signals for transmission, as described above with respect to FIG. 3. Alternatively or additionally, a power amplifier, such as PA 350 of FIG. 3, may be amplitude-modulated by the data to be transmitted, as described above with respect to FIG. 3. In some embodiments, during the data transmission in the open-loop mode, the center frequency of the RF oscillator may be monitored for background calibration.

At block 460, the control circuit may determine whether a background calibration has been performed during the data transmission as described above with respect to background calibration circuit 380 of FIG. 3 and the example described below. If a background calibration has been performed, the control circuit may save the information regarding the background calibration, such as the calibration coefficient, calibration temperature, and calibration time of the background calibration, in a memory, such as memory 366 of FIG. 3, at block 462.

If no background calibration has been performed during the data transmission or if the calibration information regarding the background calibration has been saved, the control circuit may proceed to block 470 and wait for a new request for data transmission. In some embodiments, during the wait time at block 470, at least some circuits of the wireless transmitter may be deactivated to reduce the power consumption of the wireless transmitter.

It is noted that even though FIG. 4 describes the operations as a sequential process, some of the operations may be performed in parallel or concurrently. In addition, the order of the operations may be rearranged. An operation may have additional steps not included in the figure. Some operations may be optional, and thus may be omitted in various embodiments. Some operations described in one block may be performed together with operations at another block. Furthermore, embodiments of the methods may be implemented in hardware, software, firmware, middleware, microcode, hardware description languages, or any combination thereof. Additionally, in various embodiments, different parameters may be used to determine if a new oscillator calibration is needed. For example, at block 440, additional parameters, such as the variation of the operating voltage of the RF oscillator, may be used in combination with the elapsed time and/or the operating temperature to determine whether a new oscillator calibration is needed.

As described above, during the data transmission, the center frequency of the RF oscillator may be fixed by freezing the calibration coefficient during the data transmission. To perform a background calibration, the frequency of the output signal from the RF oscillator may be measured and compared against the desired center frequency. If the measured center frequency is sufficiently different from the desired center frequency, a new calibration coefficient may need to be determined online during one or more data transmission sessions or offline for tuning the RF oscillator to the desired center frequency. However, when a frequency modulation technique is used as described above, the frequency of the output signal from the RF oscillator may be modulated by the data packet to be transmitted, which may affect the measured frequency. To account for the frequency modulation, the center frequency offset caused by the frequency modulation may be calculated based on the transmission data and deducted from the measured average frequency to determine the center frequency of the output signal from the RF oscillator.

Figure 5:
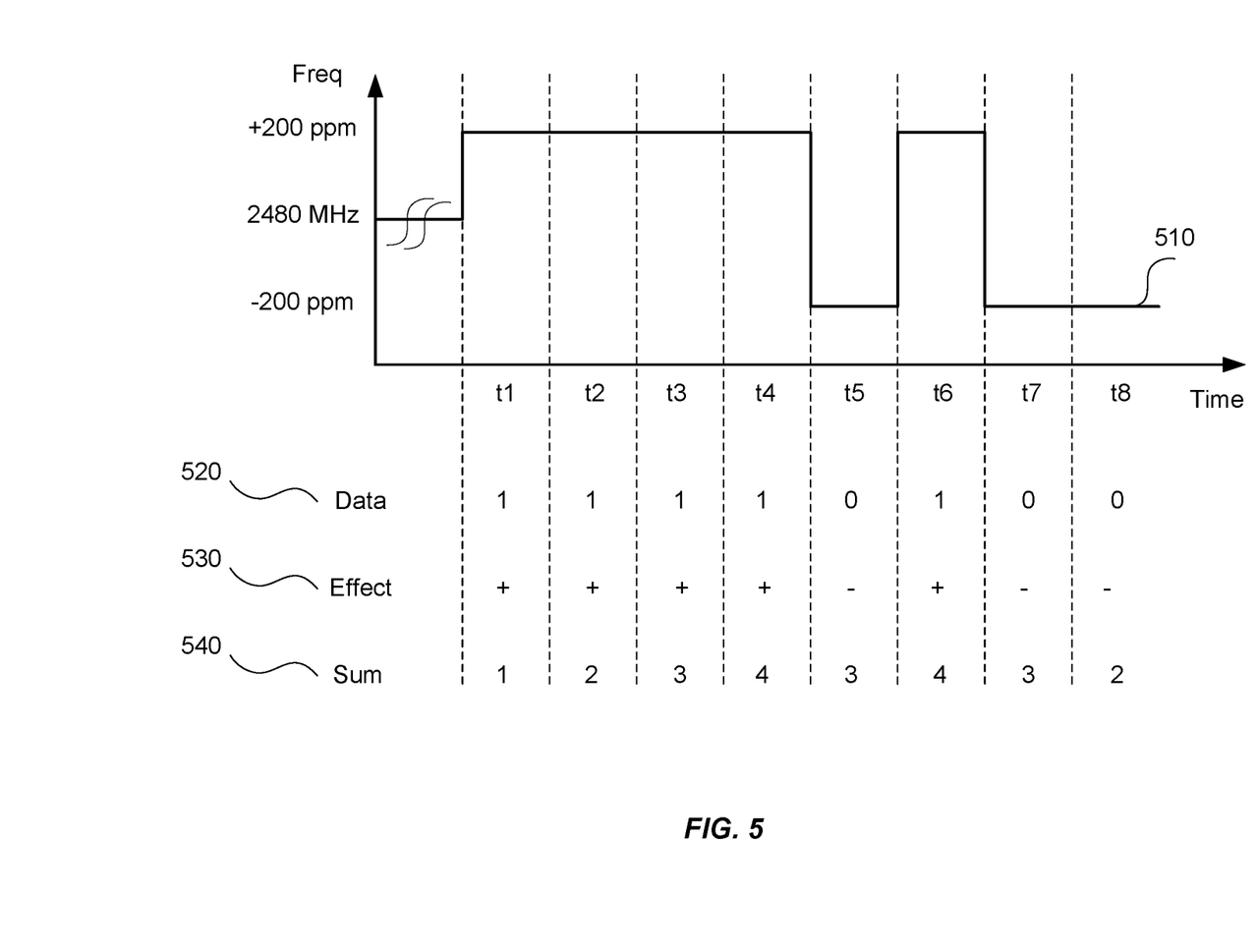
FIG. 5 shows an example method of background calibration, according to certain aspects of the present disclosure.

FIG. 5 shows an example method of background calibration, according to certain aspects of the present disclosure. FIG. 5 illustrates the oscillating frequency 510 of an RF oscillator modulated by FSK, and the corresponding data 520 to be transmitted. In the example shown in FIG. 5, the desired center frequency is 2.48 GHz, and the ppm delta for the FSK is about 200 ppm. Thus, when a "1" is to be transmitted, the oscillating frequency of the RF oscillator may be increased by 200 ppm from the center frequency, and when a "0" is to be transmitted, the oscillating frequency of the RF oscillator may be decreased by 200 ppm from the center frequency. The effect of the FSK modulation using the example data 520 on the average oscillation frequency of the RF oscillator can be illustrated by Effect 530, and the accumulated change to the center frequency of the RF oscillator may be illustrated by Sum 540.

For example, during time period t1, a "1" is transmitted, the effect of the FSK frequency modulation is to increase the average oscillating frequency of the RF oscillator, and sum 540 may be increased by 1. During time periods t2, t3, and t4, a "1" is transmitted, the oscillating frequency of the RF oscillator is increased from the center frequency. Thus, the effect of the FSK is to increase the average oscillating frequency of the RF oscillator, and Sum 540 is increased by 1 in each of time periods t2-t4 to reach 4 at the end of time period t4. During time period t5, a "0" is transmitted, the effect of the FSK modulation is to reduce the average oscillating frequency of the RF oscillator, and Sum 540 may be reduced by 1 to reach 3. During time period t6, the oscillating frequency of the RF oscillator is increased again to transmit a "1," and Sum 540 is increased by 1 again. During time periods t7 and t8, the oscillating frequency of the RF oscillator is decreased to transmit a "0," and Sum 540 is decreased by 1 in each time period to reach 2.

As such, during time periods t1-t8, the average oscillation frequency of the RF oscillator is increased by about $$\frac{2}{8} \times 200 = 50 \text{ ppm},$$

or about 124 kHz from the center frequency of 2.48 GHz. This offset may then be accounted for when determining the center frequency of the RF oscillator from the measured average frequency of the RF oscillator during time periods t1-t8.

In this way, after a data transmission session, the measured average center frequency of the RF oscillator may be determined and compared with the desired center frequency. If the measured average center frequency of the RF oscillator is sufficiently close to the desired center frequency, the calibration coefficient for the current operating temperature may be marked as "current" or the corresponding calibration time may be changed to the current time. If the measured average center frequency of the RF oscillator is beyond a guard band (e.g., ±20 ppm) of the desired center frequency, the calibration coefficient for the current operating temperature may be marked as "invalid," and a new calibration coefficient may need to be determined either in an offline closed-loop calibration or during one or more online open-loop background calibrations, as described above with respect to background calibration circuit 380 of FIG. 3. In some cases, if the measured average center frequency of the RF oscillator is close to the desired center frequency, the current calibration coefficient may be slightly adjusted and marked as "current," or the corresponding calibration time may be changed to the current time.

In embodiments where a GFSK filter is used, fractional numbers, rather than "+1" or "−1" as used in FIG. 5, may be used for transitions from "0" to "1" or from "1" to "0" to reduce errors in calculating the average frequency offset caused by the GFSK modulation of the center frequency.

Figure 6:
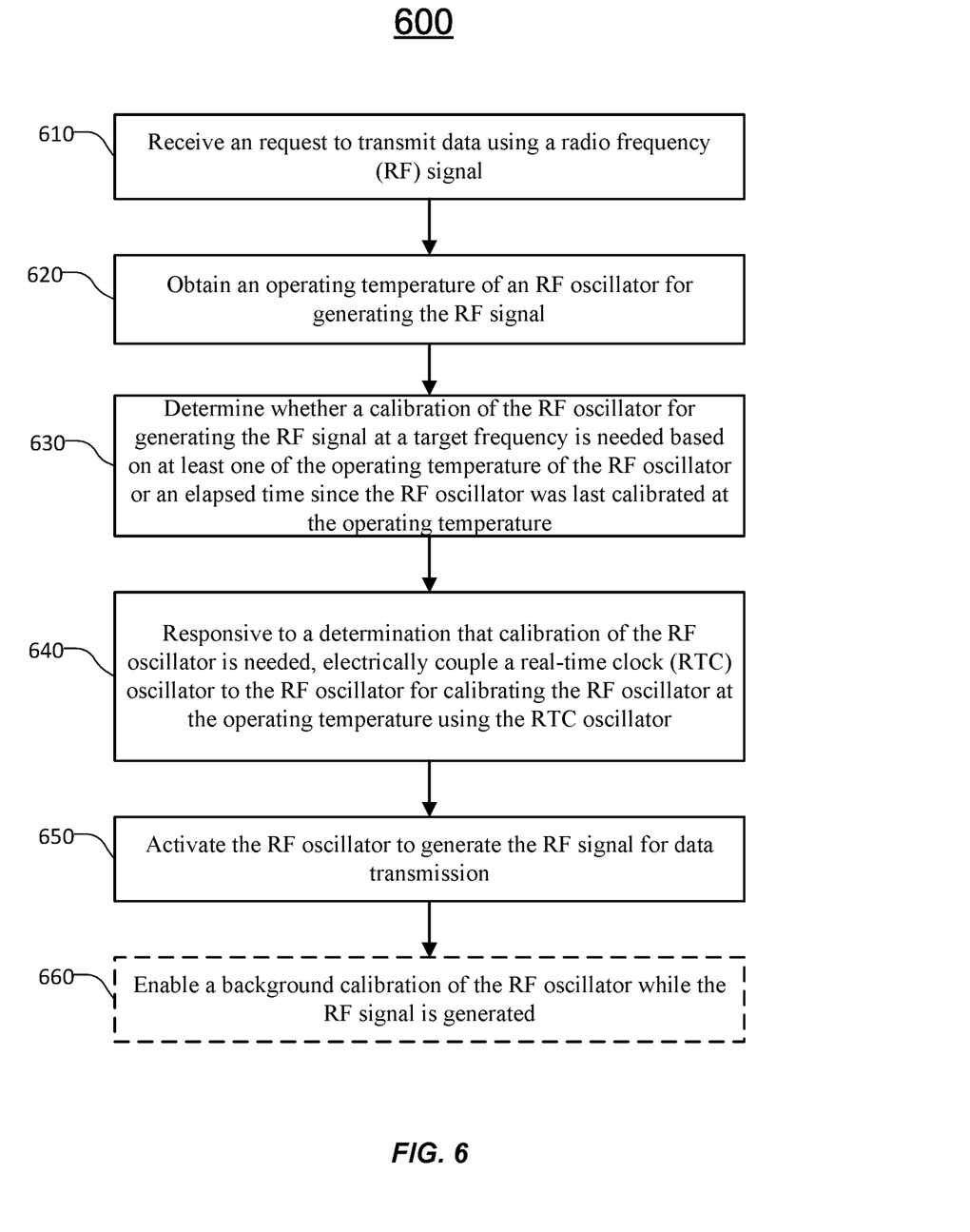
FIG. 6 shows an example method of wireless transmitter calibration and data transmission, according to certain aspects of the present disclosure.

FIG. 6 shows an example method 600 of wireless transmitter calibration and data transmission, according to certain aspects of the present disclosure. The method of FIG. 6 will be described with respect to wireless transmitter 100 shown in FIG. 1 or wireless transmitter 300 shown in FIG. 3, state machine 200 of FIG. 2, or process 400 of FIG. 4. Means for performing the method of FIG. 6 may include, for example, control circuit 140 of FIG. 1 or control circuit 360 of FIG. 3. However, the method is not limited to such wireless transmitters, processes, or control circuit. Rather, the method may be performed with any suitable wired or wireless transmitter, receiver, transceiver, and process according to this disclosure.

At block 610, a wireless transmitter, more specifically, a control circuit of the wireless transmitter, such as control circuit 140 of wireless transmitter 100 in FIG. 1 or control circuit 360 of wireless transmitter 300 in FIG. 3, may receive a request to transmit data using an RF signal. For example, the request may be to transmit BLE data packets using a center frequency of 2.480 GHz in a 376 μs BLE packet transmission session. In some embodiments, the control circuit may receive the request from, for example, a sequencer such as transmitter/packetizer/sequencer 370 of FIG. 3.

At block 620, the control circuit may obtain an operating temperature of an RF oscillator for generating the RF signal, such as an LC VCO or LC DCO, using, for example, a temperature sensor coupled to or embedded in the RF oscillator (e.g., temperature sensor 368 of FIG. 3), as described above with respect to block 420 of FIG. 2.

At block 630, the control circuit may determine whether a calibration of the RF oscillator is needed based on at least one of the operating temperature of the RF oscillator or an elapsed time since the RF oscillator was last calibrated at the operating temperature, as described above with respect to blocks 430 and 440 of FIG. 4. As described above, other parameters, such as the operating voltage of the RF oscillator, may be used, alone or in combination with other parameters, to determine if a calibration is needed.

At block 640, in response to a determination that the calibration of the RF oscillator is needed at a certain time, the control circuit may electrically couple an RTC oscillator to the RF oscillator for calibrating the RF oscillator at the operating temperature using the RTC oscillator as the reference signal. As described above, in some embodiments, the RF oscillator may be calibrated in a closed-loop mode. For example, multiplexer 340 as shown in FIG. 3 or switch 132 as shown in FIG. 1 may be used to connect or disconnect the RF oscillator from the RTC oscillator to set a closed-loop or open-loop mode of the wireless transmitter. The calibration process may apply a new calibration coefficient to the LC VCO or DCO of the RF oscillator and measure the frequency of the output RF signal from the RF oscillator, until the frequency of the output RF signal from the RF oscillator is sufficiently close to the desired center frequency, such as, for example, within 20 ppm, 10 ppm, 1 ppm, or less from the desired center frequency. The final calibration coefficient may then be saved to a memory, such as a cache, along with the calibration temperature and calibration time. As also described above, in some embodiments, the RF oscillator may be calibrated in an open-loop mode, where a PLL/FLL circuit (e.g., PLL/FLL 320) may be disconnected from the RF oscillator (e.g., LC oscillator 330), and the output of the RF oscillator and the output of RTC oscillator may both be coupled to a background calibration circuit (e.g., background calibration circuit 380) for measuring the frequency of the output signal from the RF oscillator.

At block 650, if it is determined that the calibration of the RF oscillator is not needed at block 630 or a calibration has been performed at block 640, the control circuit may decouple the RTC oscillator from the RF oscillator, and activate the RF oscillator to generate the RF signal, for example, using a calibration coefficient corresponding to the current operating temperature. In some cases, the data to be transmitted may be used to modulate the oscillating frequency of the RF oscillator, using, for example, FSK or GFSK techniques as described above. In such cases, the calibration coefficient may be modulated or altered by FM tuning codes determined from the data to be transmitted to tune the RF oscillator for direct frequency modulation of the RF oscillator. In some cases, the data to be transmitted may be used to modulate the gain of a power amplifier or the output signal amplitude of the power amplifier.

Optionally, at block 660, the control circuit may enable a background calibration of the RF oscillator while the RF signal is generated and data is transmitted, as described above with respect to FIG. 3 and FIG. 5.

It is noted that even though FIG. 6 describes the operations as a sequential process, some of the operations may be performed in parallel or concurrently. In addition, the order of the operations may be rearranged. An operation may have additional steps not included in the figure. Some operations may be optional, and thus may be omitted in various embodiments. Some operations described in one block may be performed together with operations at another block. Furthermore, embodiments of the methods may be implemented in hardware, software, firmware, middleware, microcode, hardware description languages, or any combination thereof.

The foregoing description of some examples has been presented only for the purpose of illustration and description and is not intended to be exhaustive or to limit the disclosure to the precise forms disclosed. Numerous modifications and adaptations thereof will be apparent to those skilled in the art without departing from the spirit and scope of the disclosure.

Reference herein to an example or implementation means that a particular feature, structure, operation, or other characteristic described in connection with the example may be included in at least one implementation of the disclosure. The disclosure is not restricted to the particular examples or implementations described as such. The appearance of the phrases "in one example," "in an example," "in one implementation," or "in an implementation," or variations of the same in various places in the specification does not necessarily refer to the same example or implementation. Any particular feature, structure, operation, or other characteristic described in this specification in relation to one example or implementation may be combined with other features, structures, operations, or other characteristics described in respect of any other example or implementation.

Some example wireless transmitters according to this disclosure may include a processor. The wireless transmitter may include a computer-readable medium, such as a random access memory (RAM) coupled to the processor. The processor can execute computer-executable program instructions stored in memory, such as executing one or more computer programs. Such processors may comprise a microprocessor, a digital signal processor (DSP), an application-specific integrated circuit (ASIC), field programmable gate arrays (FPGAs), and state machines. Such processors may further comprise programmable electronic devices such as PLCs, programmable interrupt controllers (PICs), programmable logic devices (PLDs), programmable read-only memories (PROMs), electronically programmable read-only memories (EPROMs or EEPROMs), or other similar devices.

Such processors may comprise, or may be in communication with, media, for example computer-readable storage media, that may store instructions that, when executed by the processor, can cause the processor to perform the steps described herein as carried out, or assisted, by a processor. Examples of computer-readable media may include, but are not limited to a memory chip, ROM, RAM, ASIC, or any other medium from which a computer processor can read or write information. The processor, and the processing, described may be in one or more structures, and may be dispersed through one or more structures. The processor may comprise code for carrying out one or more of the methods (or parts of methods) described herein.

Use herein of the word "or" is intended to cover inclusive and exclusive OR conditions. In other words, A or B or C includes any or all of the following alternative combinations as appropriate for a particular usage: A alone; B alone; C alone; A and B only; A and C only; B and C only; and all three of A and B and C.

That which is claimed is:

1. A radio frequency (RF) transmitter comprising:
   an RF oscillator;
   a temperature sensor positioned to measure a temperature of the RF oscillator;
   a real-time clock (RTC) oscillator; and
   a control circuit configured to:
      obtain an operating temperature of the RF oscillator from the temperature sensor; and
      responsive to determining a calibration of the RF oscillator is needed based on at least one of the operating temperature of the RF oscillator or an elapsed time since the RF oscillator was last calibrated at the operating temperature:
         electrically couple the RF oscillator to the RTC oscillator; and
         initiate calibrating of the RF oscillator using the RTC oscillator; and
      activate the RF oscillator to operate in an open-loop mode to generate an RF signal for data transmission.

2. The RF transmitter of claim 1, wherein the RTC oscillator is configured to generate a 32.768 kHz signal using a watch crystal.

3. The RF transmitter of claim 1, wherein:
   when the RF oscillator is electrically coupled to the RTC oscillator, the RF oscillator and the RTC oscillator form at least a part of a closed phase-locked loop or a closed frequency-locked loop;
   the calibrating of the RF oscillator using the RTC oscillator is performed using the closed phase-locked loop or the closed frequency-locked loop; and
   the control circuit is configured to activate the RF oscillator to operate in the open-loop mode after the calibrating of the RF oscillator using the RTC oscillator.

4. The RF transmitter of claim 1, wherein the control circuit is configured to initiate the calibrating of the RF oscillator using the RTC oscillator based on the operating temperature and for a target frequency of the RF oscillator.

5. The RF transmitter of claim 1, further comprising a memory for storing a calibration table, wherein the calibration table includes one or more entries, each entry comprising a calibration temperature, a calibration time, and one or more calibration coefficients for the RF oscillator.

6. The RF transmitter of claim 5, wherein the control circuit is further configured to:
determine that the calibration of the RF oscillator is needed in response to a determination of at least one of: (1) the calibration table does not include an entry corresponding to the operating temperature, or (2) an entry in the calibration table corresponding to the operating temperature indicates an elapsed time greater than a threshold time value.

7. The RF transmitter of claim 6, wherein the determination that the calibration table does not include an entry corresponding to the operating temperature includes determining that the operating temperature differs from the calibration temperature of any entry in the calibration table by more than a threshold temperature value.

8. The RF transmitter of claim 5, wherein the control circuit is configured to, in response to the calibrating of the RF oscillator using the RTC oscillator, update the calibration table based on the operating temperature, a calibration time, and one or more calibration coefficients determined by the calibration.

9. The RF transmitter of claim 5, wherein the control circuit is further configured to:
identify an entry in the calibration table corresponding to the operating temperature of the RF oscillator; and
apply the one or more calibration coefficients in the identified entry to the RF oscillator.

10. The RF transmitter of claim 5, wherein:
each entry of the calibration table further includes a target frequency of the RF oscillator; and
the calibration table includes entries for one or more target frequencies of the RF oscillator.

11. The RF transmitter of claim 1, wherein the RF oscillator comprises one of an inductor-capacitor (LC) voltage-controlled oscillator (VCO), or an LC digitally-controlled oscillator (DCO).

12. The RF transmitter of claim 1, further comprising a data injection circuit configured to modulate the RF oscillator with data to be transmitted.

13. The RF transmitter of claim 12, wherein the data injection circuit includes one of a frequency shift keying (FSK) modulator and a Gaussian FSK modulator.

14. The RF transmitter of claim 1, further comprising a background calibration circuit, wherein:
the control circuit is configured to:
electrically couple the RF oscillator to the RTC oscillator by coupling an output of the RF oscillator and an output of the RTC oscillator to the background calibration circuit; and
initiate calibrating of the RF oscillator using the RTC oscillator by the background calibration circuit in the open-loop mode; and
the background calibration circuit is configured to:
determine, using the RTC oscillator, a center frequency of the RF signal generated by the RF oscillator; and
compare the determined center frequency with a target frequency of the RF oscillator.

15. The RF transmitter of claim 1, further comprising:
a power amplifier coupled to the RF oscillator; and
a data injection circuit configured to modulate a gain of the power amplifier using data to be transmitted.

16. A wireless transmitter comprising:
an inductor-capacitor (LC) oscillator;
a real-time clock (RTC) oscillator selectively couplable to the LC oscillator; and
a control circuit in communication with the LC oscillator and the RTC oscillator, the control circuit configured to:
obtain an operating temperature of the LC oscillator from a temperature sensor;
determine whether a calibration of the LC oscillator is needed based on at least one of: the operating temperature of the LC oscillator or an elapsed time since the LC oscillator was last calibrated at the operating temperature;
responsive to a determination that the calibration of the LC oscillator is needed, electrically couple the RTC oscillator to the LC oscillator to form a closed loop; and
initiate calibrating of the LC oscillator using the RTC oscillator in the closed loop.

17. The wireless transmitter of claim 16, wherein the RTC oscillator is configured to generate a 32.768 kHz signal using a watch crystal.

18. The wireless transmitter of claim 16, wherein the control circuit is further configured to:
responsive to a determination that the calibration of the LC oscillator is not needed, keep the RTC oscillator disconnected from the LC oscillator; and
activate the LC oscillator to generate a radio frequency (RF) signal for data transmission while the RTC oscillator remains disconnected from the LC oscillator.

19. The wireless transmitter of claim 16, further comprising a frequency modulator configured to generate tuning codes to modulate the LC oscillator based on data to be transmitted.

20. The wireless transmitter of claim 19, wherein the frequency modulator includes one of a frequency shift keying (FSK) modulator and a Gaussian FSK modulator.

21. The wireless transmitter of claim 16, further comprising a memory device for storing a calibration table,
wherein the calibration table comprises one or more entries, each entry comprising a calibration temperature, a calibration time, and one or more calibration coefficients for the LC oscillator;
wherein the control circuit is further configured to:
search the calibration table to identify an entry in the calibration table corresponding to the operating temperature of the LC oscillator;
responsive to no identification of an entry corresponding to the operating temperature of the LC oscillator in the calibration table, determine that the calibration is needed; and
responsive to identification of an entry corresponding to the operating temperature of the LC oscillator in the calibration table:
determine an elapsed time based on the calibration time in the entry; and
responsive to determining the elapsed time exceeds a threshold time value, determine that the calibration is needed; otherwise, determine that the calibration is not needed; and
wherein the control circuit is further configured to, after the calibration is performed, update the calibration table to include an entry with the operating temperature, a time of the calibration, and one or more calibration coefficients determined by the calibration.

22. The wireless transmitter of claim 21, wherein an entry in the calibration table corresponds to the operating temperature when the operating temperature differs from the calibration temperature of the entry by less than a threshold temperature value.

23. The wireless transmitter of claim 21, wherein the control circuit is further configured to activate the LC oscillator to generate an RF signal for data transmission.

24. The wireless transmitter of claim 21, wherein the control circuit is further configured to:
   identify an entry in the calibration table corresponding to the operating temperature of the LC oscillator and indicating an elapsed time no greater than the threshold time value; and
   apply the one or more calibration coefficients in the identified entry to the LC oscillator.

25. A method comprising:
   receiving a request to transmit data using a radio frequency (RF) signal;
   obtaining an operating temperature of an inductor-capacitor (LC) oscillator for generating the RF signal;
   determining whether a calibration of the LC oscillator for generating the RF signal at a target frequency is needed based on at least one of: the operating temperature of the LC oscillator or an elapsed time since the LC oscillator was last calibrated at the operating temperature;
   responsive to a determination that the calibration of the LC oscillator is needed, electrically coupling a real-time clock (RTC) oscillator to the LC oscillator and initiating calibrating the LC oscillator at the operating temperature using the RTC oscillator; and
   activating the LC oscillator to generate the RF signal for data transmission.

26. The method of claim 25, wherein the RTC oscillator is configured to generate a 32.768 kHz signal using a watch crystal.

27. The method of claim 25, wherein determining whether the calibration of the LC oscillator is needed includes:
   searching a calibration table including one or more entries, each entry comprising a calibration temperature, a calibration time, and one or more calibration coefficients for the RF oscillator; and
   determining that the calibration of the LC oscillator is needed in response to a determination of at least one of: (1) the calibration table does not include an entry corresponding to the operating temperature, or (2) an entry in the calibration table corresponding to the operating temperature indicates an elapsed time greater than a threshold time value.

28. The method of claim 27, further comprising updating the calibration table after the calibration is performed.

29. The method of claim 28, wherein activating the LC oscillator to generate the RF signal for data transmission includes:
   identifying an entry in the calibration table corresponding to the operating temperature and indicating an elapsed time no greater than the threshold time value; and
   applying the one or more calibration coefficients in the identified entry to the LC oscillator.

* * * * *